(12) United States Patent
Zhao

(10) Patent No.: US 9,153,751 B2
(45) Date of Patent: Oct. 6, 2015

(54) COLOR FILTER ON ARRAY SUBSTRATE AND A MANUFACTURING METHOD FOR THE SAME

(75) Inventor: Xiaohu Zhao, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 13/698,255

(22) PCT Filed: Aug. 13, 2012

(86) PCT No.: PCT/CN2012/080007
§ 371 (c)(1),
(2), (4) Date: Nov. 15, 2012

(87) PCT Pub. No.: WO2014/012285
PCT Pub. Date: Jan. 23, 2014

(65) Prior Publication Data
US 2014/0021494 A1 Jan. 23, 2014

(30) Foreign Application Priority Data
Jul. 20, 2012 (CN) .......................... 2012 1 0252155

(51) Int. Cl.
*H01L 21/00* (2006.01)
*H01L 33/50* (2010.01)
*G02F 1/1362* (2006.01)

(52) U.S. Cl.
CPC .............. *H01L 33/50* (2013.01); *G02F 1/1362* (2013.01); *G02F 2001/136222* (2013.01); *G02F 2001/136231* (2013.01)

(58) Field of Classification Search
CPC .............. G02F 1/135; G02F 1/136213; G02F 1/136286; G02F 1/133514; G02F 1/134309; H01L 33/50; H01L 27/322; H01L 27/1214; H01L 27/3244; H01L 27/12
USPC .................. 438/30, 70, 72, 149; 257/98, 294, 257/E51.005, E29.151
See application file for complete search history.

(56) References Cited

U.S. PATENT DOCUMENTS 7,477,345 B2 1/2009 Kim et al.
7,545,463 B2 6/2009 Park
(Continued)

FOREIGN PATENT DOCUMENTS

CN 1506721 6/2004
CN 1716061 1/2006
(Continued)

*Primary Examiner* — Michelle Mandala
(74) *Attorney, Agent, or Firm* — Kirton McConkie; Evan R. Witt

(57) ABSTRACT

A color filter on array (COA) substrate and a manufacturing method for the same are proposed. The COA substrate includes a transparent substrate, a thin film transistor (TFT), a color filter unit, and a pixel electrode. The color filter unit is disposed in a groove of the transparent substrate for transforming a beam of light sent to the color filter unit into the beam of light of a predetermined hue. The pixel electrode is disposed on the color filter unit and coupled to a drain of the TFT. The pixel electrode is used for controlling the rotational alignment of liquid crystals in a liquid crystal layer based upon the electrical level of an electrical signal transmitted to the drain when a scan impulse is received by a gate of the TFT. In addition, the color filter unit is formed in the groove, and the pixel electrode is formed on the color filter unit, implying that it is unnecessary to form a via on a passivation layer so that the drain could be connected to the pixel electrode through the via. Thus, etching the passivation layer for forming the via is omitted in the present invention.

13 Claims, 11 Drawing Sheets

(56) References Cited

U.S. PATENT DOCUMENTS

| | | |
|---|---|---|
| 7,932,972 B2 * | 4/2011 | Oh ................................. 349/106 |
| 8,035,766 B2 | 10/2011 | Kim et al. |
| 2003/0071955 A1 * | 4/2003 | Nakayoshi et al. ............ 349/154 |
| 2004/0126914 A1 * | 7/2004 | Chang et al. .................... 438/30 |
| 2007/0132934 A1 * | 6/2007 | Amano ........................ 349/153 |
| 2008/0068536 A1 | 3/2008 | Kim et al. |
| 2009/0191654 A1 * | 7/2009 | Yu et al. .......................... 438/29 |
| 2009/0244441 A1 | 10/2009 | Nagato et al. |
| 2010/0002182 A1 * | 1/2010 | Lee et al. ....................... 349/154 |

FOREIGN PATENT DOCUMENTS

| | | |
|---|---|---|
| CN | 100412664 | 8/2008 |
| CN | 101546084 | 9/2009 |
| JP | 2002333616 | 11/2002 |

\* cited by examiner

COLOR FILTER ON ARRAY SUBSTRATE AND A MANUFACTURING METHOD FOR THE SAME

BACKGROUND OF THE INVENTION

1. Field of the Invention

The present invention relates to a liquid crystal display (LCD) panel and a manufacturing method for the same, and more particularly, to a color filter on array (COA) substrate and a manufacturing method for the same.

2. Description of the Prior Art

An advanced monitor with multiple functions is an important feature for use in current consumer electronic products. Liquid crystal displays (LCDs) which are colorful monitors with high resolution are widely used in various electronic products such as monitors for mobile phones, personal digital assistants (PDAs), digital cameras, laptop computers, and notebook computers.

A conventional LCD panel comprises a color filter substrate, a thin film transistor array substrate (TFT array substrate), and a liquid crystal layer disposed between the color filter substrate and the TFT array substrate. However, the conventional LCD panel has disadvantages of a worse resolution, a lower aperture ratio of a pixel, and a misalignment which easily occurs when the color filter substrate joints the TFT array substrate.

In recent years, a new LCD panel is provided. The color filter layer is integrated into a color filter on array (COA) substrate placed on the TFT array substrate. The COA substrate and an opposite substrate which does not comprise a color filter layer are assembled. Liquid crystals are inserted into a domain between the COA substrate and the opposite substrate, which is the structure of the new LCD panel. Since the color filter layer is directly formed on the TFT array substrate, no misalignment could occur to the LCD panel. Furthermore, the LCD panel has advantages of a better resolution and a higher aperture ratio of the pixel.

The process of the conventional COA substrate comprises the steps of; first, forming a TFT matrix on a substrate; secondly, depositing a color filter, a transparent conducting layer, and an alignment film successively on the substrate for forming the COA substrate; thirdly, deposing liquid crystals on the COA substrate; finally, adhering an opposite substrate to the COA substrate using a sealant disposed around the periphery of the first substrate. An LCD panel is formed accordingly.

A passivation layer covering a drain of the TFT needs etching for forming a via so that the drain which is turned on could be connected to the transparent conducting layer. To prevent the displaying effects of the LCD panel from being affected, the thickness of the color filter is about ten times of the thickness of the drain. However, the lateral wall of the via is slanted at an angle of close to 90 degrees because of the difference of the thickness between the color filter and the drain, which hinders the transparent conducting layer from being deposited on the via. Moreover, electro static discharge (ESD) may occur on the LCD panel.

SUMMARY OF THE INVENTION

Therefore, an object of the present invention is to provide a COA substrate and a manufacturing method for the same.

According to the present invention, a manufacturing method for a color filter on array (COA) substrate comprises the following steps of: providing a transparent substrate; etching the transparent substrate for forming a first groove; depositing a color filter layer on the transparent substrate and etching the color filter layer, for forming a color filter unit in the first groove and then forming a pixel electrode on the color filter unit; and forming a thin film transistor (TFT) on the transparent substrate so as to connect the TFT to the pixel electrode.

In one aspect of the present invention, the transparent substrate comprises a base and an insulating layer, and the step of etching the transparent substrate for forming a first groove is: etching the insulating layer for forming the first groove.

In another aspect of the present invention, the step of forming the TFT comprises the following steps of: forming a first metal layer on the transparent substrate and etching the first metal layer for forming a gate of the TFT; depositing the insulating layer on the transparent substrate and the gate; depositing an active layer and an ohmic contact layer on the insulating layer; etching the active layer and the ohmic contact layer so that the active layer is used as a channel of the TFT; depositing a second metal layer on the ohmic contact layer and the insulating layer and etching the second metal layer for forming a source and a drain of the TFT on the ohmic contact layer, and the drain connected to the pixel electrode; and depositing a passivation layer on the source, the drain, the pixel electrode, and the insulating layer.

In still another aspect of the present invention, the step of forming the TFT comprises the following steps of: forming a first metal layer on the transparent substrate and etching the first metal layer for forming the gate of the TFT; depositing an insulating layer on the transparent substrate and the gate; depositing an active layer, an ohmic contact layer, and a second metal layer successively on the insulating layer; etching the second metal layer and the ohmic contact layer so that the active layer is used as the channel of the TFT, meanwhile, forming the source and the drain of the TFT on the ohmic contact layer, and the drain connected to the pixel electrode; depositing a passivation layer on the source, the drain, the pixel electrode, and the insulating layer.

In yet another aspect of the present invention, the manufacturing method further comprises: forming a second groove while the transparent substrate is etched, and the second groove disposed at a periphery of the transparent substrate.

According to the present invention, a manufacturing method for a COA substrate, comprises the following steps of: providing a transparent substrate; etching the transparent substrate for forming a first groove; depositing a color filter layer on the transparent substrate and etching the color filter layer for forming a color filter unit in the first groove; depositing a spacer layer on the color filter layer; depositing a transparent conducting layer on the spacer layer and etching the transparent conducting layer, for forming the pixel electrode on top of the color filter unit; and forming a TFT on the transparent substrate so as to connect the TFT to the pixel electrode.

In one aspect of the present invention, the transparent substrate comprises a base and an insulating layer, and the step of etching the transparent substrate for forming the first groove is: etching the insulating layer for forming the first groove.

In another aspect of the present invention, the step of forming the TFT comprises the following steps of: forming a first metal layer on the transparent substrate and etching the first metal layer, for forming a gate of the TFT; depositing an insulating layer on the transparent substrate and the gate; depositing an active layer and an ohmic contact layer on the insulating layer; etching the active layer and the ohmic contact layer so that the active layer is used as a channel of the TFT; depositing a second metal layer on the ohmic contact layer and the insulating layer and etching the second metal layer forming a source and a drain of the TFT on the ohmic contact layer, and the drain connected to the pixel electrode; and depositing a passivation layer on the source, the drain, the pixel electrode, and the insulating layer.

In another aspect of the present invention, the manufacturing method further comprises: forming a second groove while the transparent substrate is etched, and the second groove disposed at a periphery of the transparent substrate.

In still another aspect of the present invention, the manufacturing method further comprises steps interposed between the step of depositing a color filter layer on the transparent substrate and etching the color filter layer for forming the color filter unit in the first groove and the step of depositing a spacer layer on the color filter layer: forming a first metal layer on the transparent substrate and etching the first metal layer, for forming the gate of the TFT; and depositing an insulating layer on the transparent substrate and the gate.

In still another aspect of the present invention, the step of forming the TFT comprises the following steps of: depositing an active layer and an ohmic contact layer on the insulating layer; etching the active layer and the ohmic contact layer so that the active layer is used as the channel of the TFT; depositing a second metal layer on the ohmic contact layer and the insulating layer and etching the second metal layer, forming the source and the drain of the TFT on the ohmic contact layer, and the drain connected to the pixel electrode; and depositing a passivation layer on the source, the drain, the pixel electrode, and the insulating layer.

In yet another aspect of the present invention, the step of forming the TFT comprises the following steps of: depositing an active layer, an ohmic contact layer, and a second metal layer on the insulating layer, and etching the active layer, the ohmic contact layer, and the second metal layer, forming a the channel, the source and the drain of the TFT, and the drain connected to the pixel electrode; and depositing a passivation layer on the source, the drain, the pixel electrode, and the insulating layer.

According to the present invention, a COA substrate comprises: a transparent substrate, comprising a first groove; a TFT, disposed on the transparent substrate and comprising a gate, a drain, and a source; a color filter unit, disposed in the first groove; and a pixel electrode, disposed on the color filter unit and coupled to the drain of the TFT.

In one aspect of the present invention, the transparent substrate comprises a base and an insulating layer, and the first groove is formed by etching the insulating layer.

In another aspect of the present invention, the COA substrate further comprises a spacer layer disposed between the color filter unit and the pixel electrode.

In yet another aspect of the present invention, the COA substrate further comprises a second groove disposed at a periphery of the transparent substrate.

In the present invention, the substrate is etched for forming a first groove, a color filter unit is formed on the first groove, and a pixel electrode is formed on the color filter unit. In other words, the color filter unit is formed on the first groove, and the pixel electrode is formed on the color filter unit. It is unnecessary to form a via through which the drain of the TFT is connected to the pixel electrode on a passivation layer. So etching the passivation layer for forming the via is omitted in the present invention. In addition, the pixel electrode is disposed on top of the color filter unit, implying that it is impossible for the transparent conducting layer to be used as the pixel electrode. It is unnecessary to worry about the deposition of the transparent conducting layer on the via of the passivation layer. Therefore, ESD will not occur on the finished LCD panel. Moreover, a transparent substrate is etched for forming a second groove in the present invention. The second groove is formed at the periphery of the transparent substrate. The second groove could be used for collecting abundant sealant materials or abundant materials for fabricating an alignment film, preventing the sealant from overlapping the alignment film. Since the sealant does not overlap the alignment film, the yield of the LCD panel is not negatively affected.

These and other features, aspects and advantages of the present disclosure will become understood with reference to the following description, appended claims and accompanying figures.

DETAILED DESCRIPTION OF THE PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
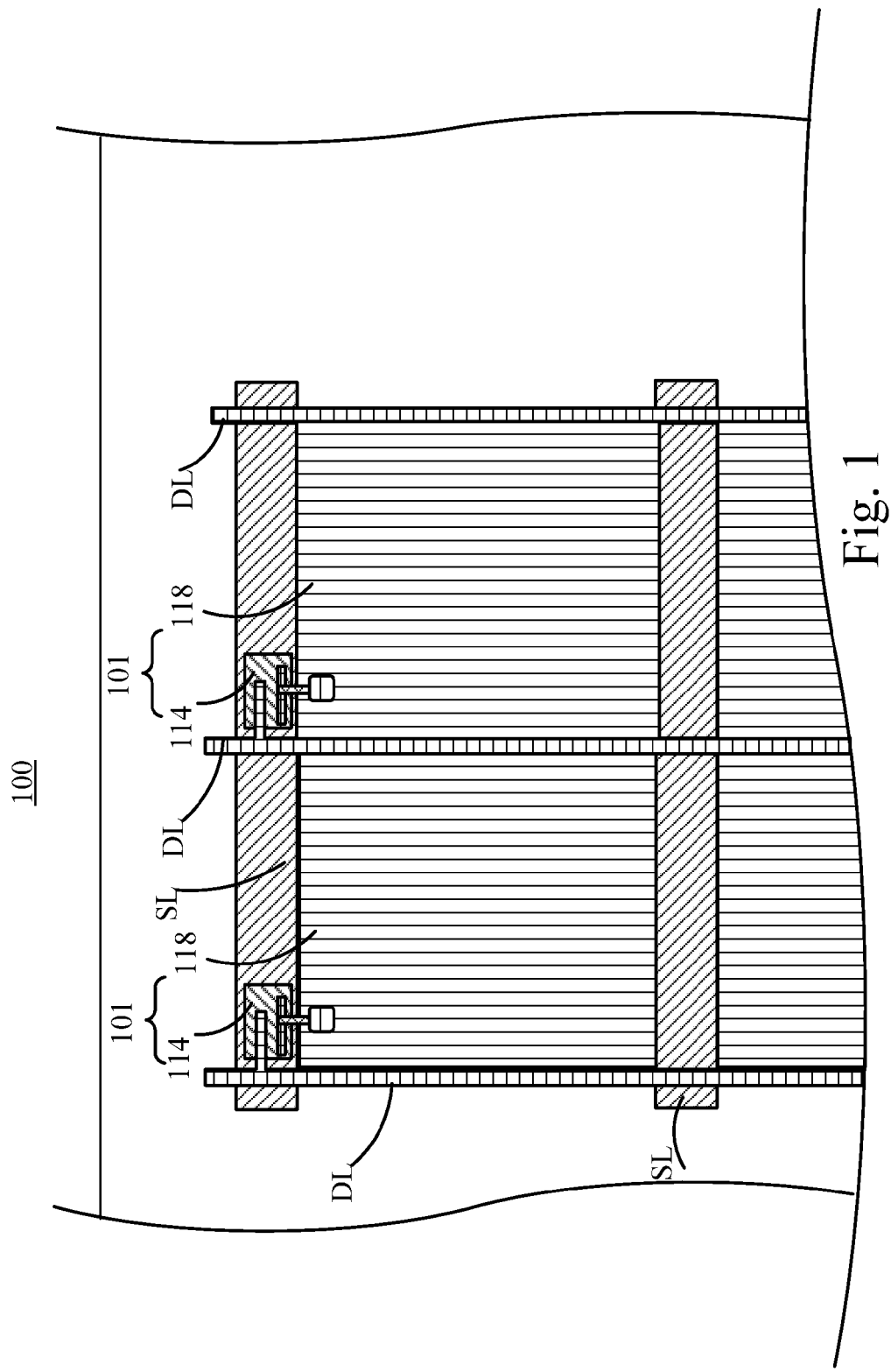
FIG. 1 is a schematic diagram of an LCD panel according to an embodiment of the present invention.

Referring to FIG. 1, FIG. 1 is a schematic diagram of an LCD panel 100 according to an embodiment of the present invention. The LCD panel 100 comprises a plurality of pixels 101, a plurality of scan lines SL, and a plurality of data lines DL. Each of the plurality of pixels 101 comprises a TFT 114 and a pixel electrode 118. The TFT 114 is electrically connected to the pixel electrode 118, a scan line SL, and a data line DL.

Figure 2:
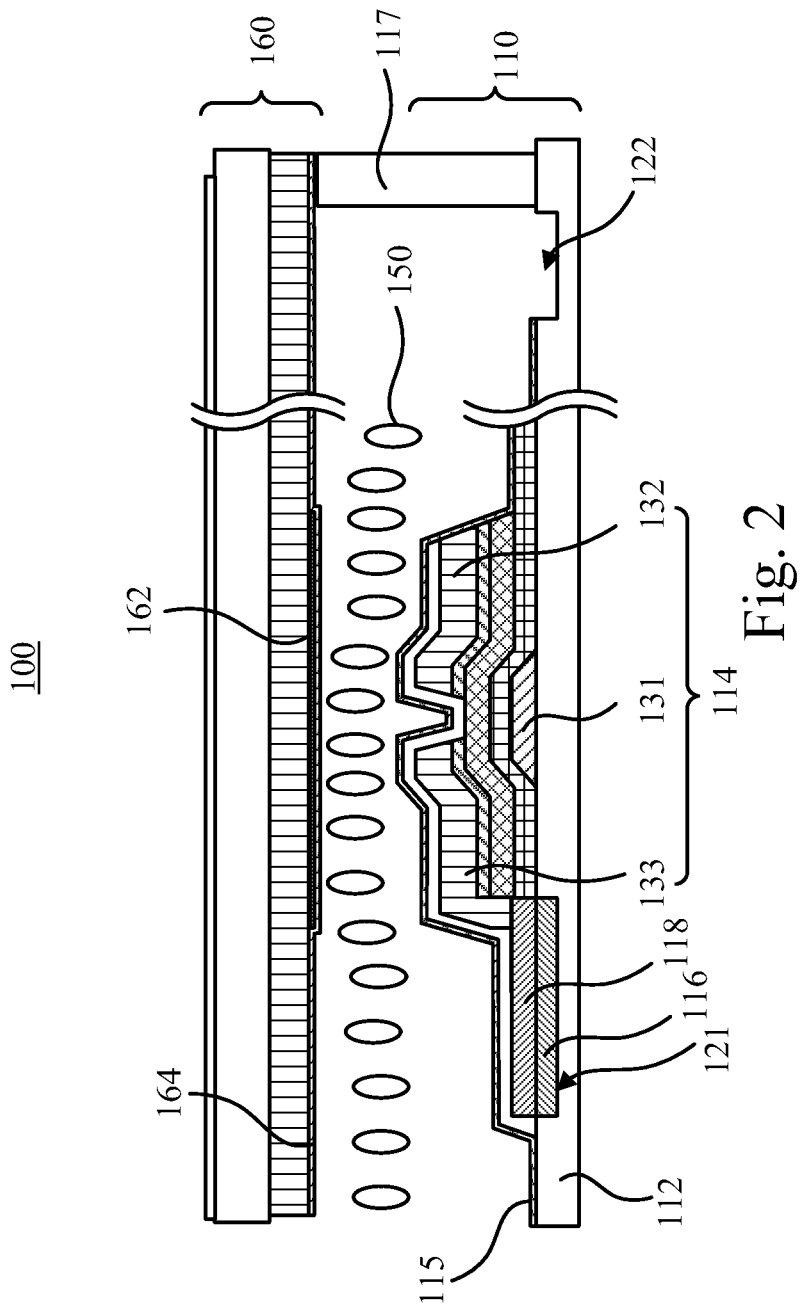
FIG. 2 is a cross-sectional view of the LCD panel as shown in FIG. 1 according to a first embodiment of the present invention.

Referring to FIG. 2, FIG. 2 is a cross-sectional view of the LCD panel 100 as shown in FIG. 1 according to a first embodiment of the present invention. The LCD panel 100 comprises a COA substrate 110, a liquid crystal layer 150, and an opposite substrate 160. The liquid crystal layer 150 is disposed between the COA substrate 110 and the opposite substrate 160. For better understanding, FIG. 2 only illustrates a cross-sectional domain which a pixel 101 corresponds to. The COA substrate 110 comprises a transparent substrate 112, a TFT 114, a color filter unit 116, and a pixel electrode 118. A first groove 121 is formed in the transparent substrate 112. The color filter unit 116 is disposed in the first groove 121 and used for transforming a beam of light into the beam of light of a predetermined hue. The beam of light is produced by a backlight source (not shown) and sent to the color filter unit 116. For example, the color filter unit 116 may be a red filter unit, a blue filter unit, or a green filter unit. The red, blue, and green filter units are used for filtering the light beam. The filtered light beam becomes a red light beam, a blue light beam, and a green light beam, respectively. The TFT 114 is disposed on the transparent substrate 112. The TFT 114 comprises a gate 131, a source 132, and a drain 133. The gate 131 is coupled to the scan line SL. The source 132 is coupled to the data line DL. The pixel electrode 118 is disposed on the color filter unit 116 and coupled to the drain 133. The source 132 and the drain 133 would be turned on when a scan impulse is transmitted to the gate 131 through the scan line SL. Next, a data signal would pass through the source 132 and the drain 133 and arrive at the pixel electrode 118 through the data line DL. The opposite substrate 160 comprises a black matrix layer 162 and a conducting layer 164. The black matrix layer 162 is disposed on top of the TFT 114 for obstructing the beam of light. The conducting layer 164 is electrically connected to a common voltage terminal for receiving constant voltage. Rotational alignment of liquid crystals in the liquid crystal layer 150 is controlled by the data signal at the electrical level and the constant voltage received by the conducting layer 164.

The COA substrate 110 further comprises an alignment film 115 and a sealant 117. The alignment film 115 is used for adjusting the alignment of the liquid crystals in the liquid crystal layer 150. First, the alignment film 115 is formed; the liquid crystal layer 150 is formed on the COA substrate 110 comprising the alignment film 115; the sealant 117 is disposed around the periphery of the COA substrate 110. Subsequently, the COA substrate 110 is glued to the opposite substrate 160 using the sealant 117. The alignment film 115 is formed after polyimide (PI) drops are spread, so the spread materials for fabricating the alignment film 115 might overflow. Likewise, the sealant 117 might be squeezed when the COA substrate 110 is glued to the opposite substrate 160, which causes the sealant 117 to overlap the alignment film 115. In the present embodiment, the COA substrate 110 further comprises a second groove 122 disposed around the periphery of the transparent substrate 112. The second groove 122 could be used for collecting the overflowing materials for fabricating the alignment film 115 or the abundant sealant materials so the overflowing materials for fabricating the alignment film 115 will not overlap the abundant sealant materials.

Referring to FIGS. 3 to 8, FIGS. 3 to 8 show schematic diagrams of manufacturing the COA substrate 110 as shown in FIG. 2.

Figure 3:
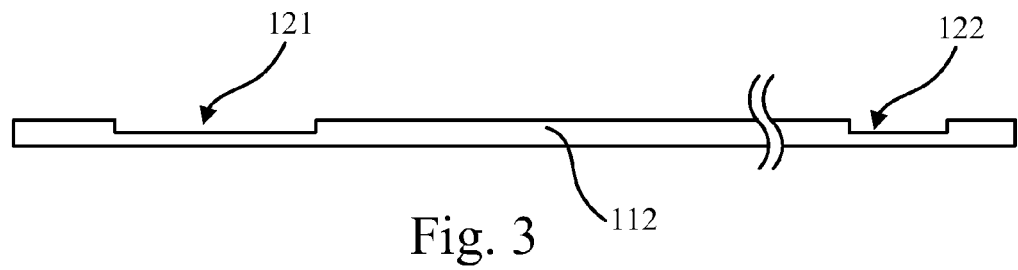
FIGS. 3 to 8 show schematic diagrams of manufacturing the COA substrate as shown in FIG. 2.

Please refer to FIG. 3. First, the transparent substrate 112 is provided. The transparent substrate 112 is etched, using a first mask (not shown), for forming the first groove 121 and the second groove 122. The second groove 122 is disposed around the periphery of the transparent substrate 112.

Figure 4:
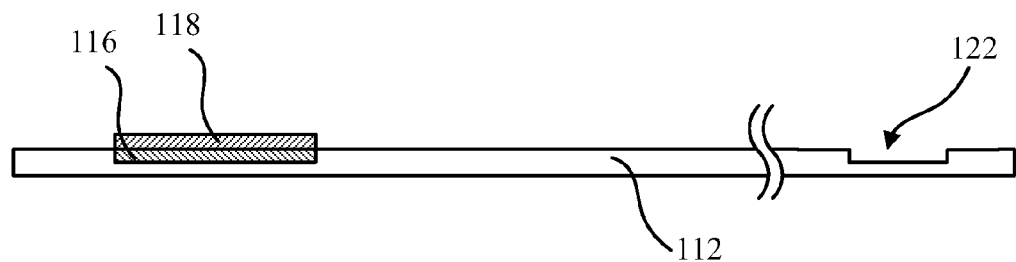

Please refer to FIG. 4. Next, a color filter layer is deposited on the transparent substrate 112 and etched, using a second mask (not shown), so that the color filter unit 116 could be formed in the first groove 121, and then formed the pixel electrode 118 on the color filter unit 116.

Figure 5:
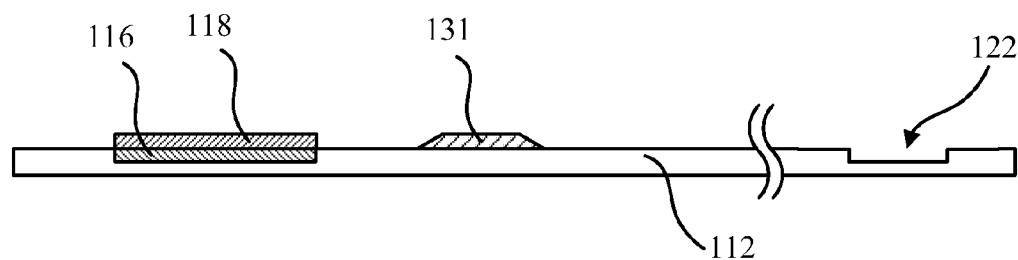

Please refer to FIG. 5. A first metal layer is formed on the transparent substrate 112. The first metal layer is etched, using a third mask (not shown), so that the scan line SL and the gate 131 of the TFT 114 could be formed. The scan line SL and the gate 131 are formed using the same metal layer.

Figure 6:
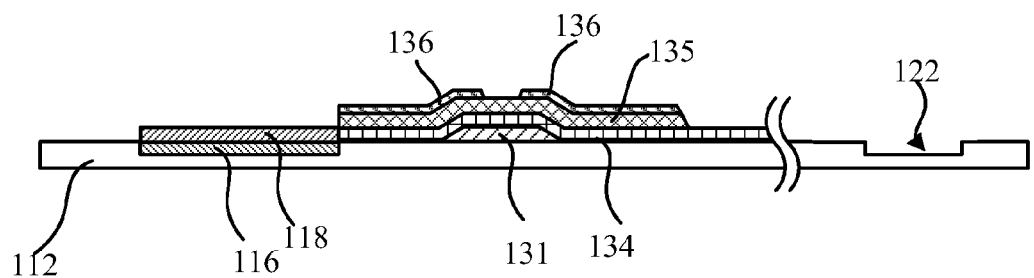

Please refer to FIG. 6. An insulating layer 134 is deposited on the transparent substrate 112, the scan line SL, and the gate 131. Next, an active layer 135 and an ohmic contact layer 136 are deposited on the insulating layer 134. At this point, the active layer 135 and the ohmic contact layer 136 are etched, using a fourth mask (not shown), for forming a channel of the TFT 114.

Figure 7:
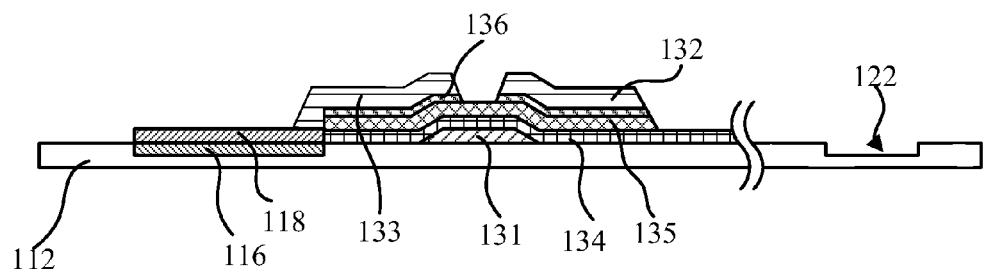

Please refer to FIG. 7. A second metal layer is deposited on the ohmic contact layer 136 and the insulating layer 134. The second metal layer is etched, using a fifth mask (not shown), for forming the data line DL. At this point, the source 132 and the drain 133 are formed on the ohmic contact layer 136. The drain 133 is connected to the pixel electrode 118. The data line DL, the source 132, and the drain 133 are formed using the same metal layer.

Figure 8:
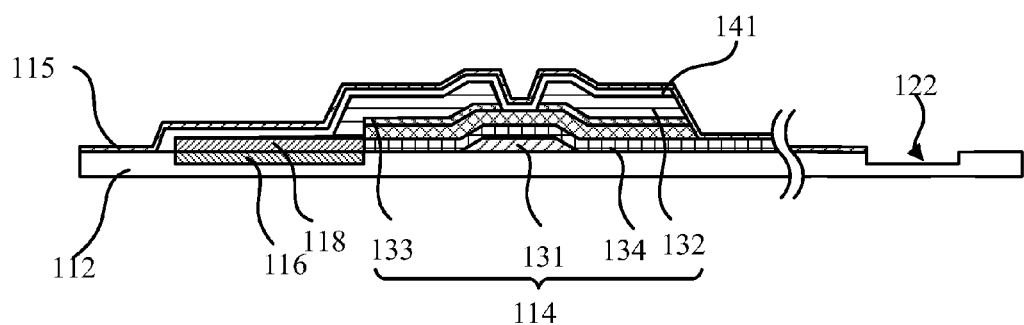

Please refer to FIG. 8. A passivation layer 141 is deposited on the ohmic contact layer 136, the source 132, the drain 133, and the pixel electrode 118. The passivation layer 141 is used for separating the liquid crystal layer 150 (referring to FIG. 2) from the TFT 114. Afterwards, the TFT 114 which has been formed on the transparent substrate 112 is connected to the pixel electrode 118. Finally, the PI drops are spread to form an alignment film 115. The following steps will be readily apparent to those skilled in the art, so the detailed description of the following steps will not herein be repeated.

Followed by the process as shown in FIG. 5, another process could be that the insulating layer 134, the active layer 135, the ohmic contact layer 136, and the second metal layer are successively deposited. Afterwards, the second metal layer, the ohmic contact layer 136, and the active layer 135 are etched, using the fourth mask, for forming the source 132, the drain 133, and the channel of the TFT 114. Finally, the passivation layer 141 and the alignment film 115 are formed on the ohmic contact layer 136, the source 132, the drain 133, and the pixel electrode 118.

Figure 9:
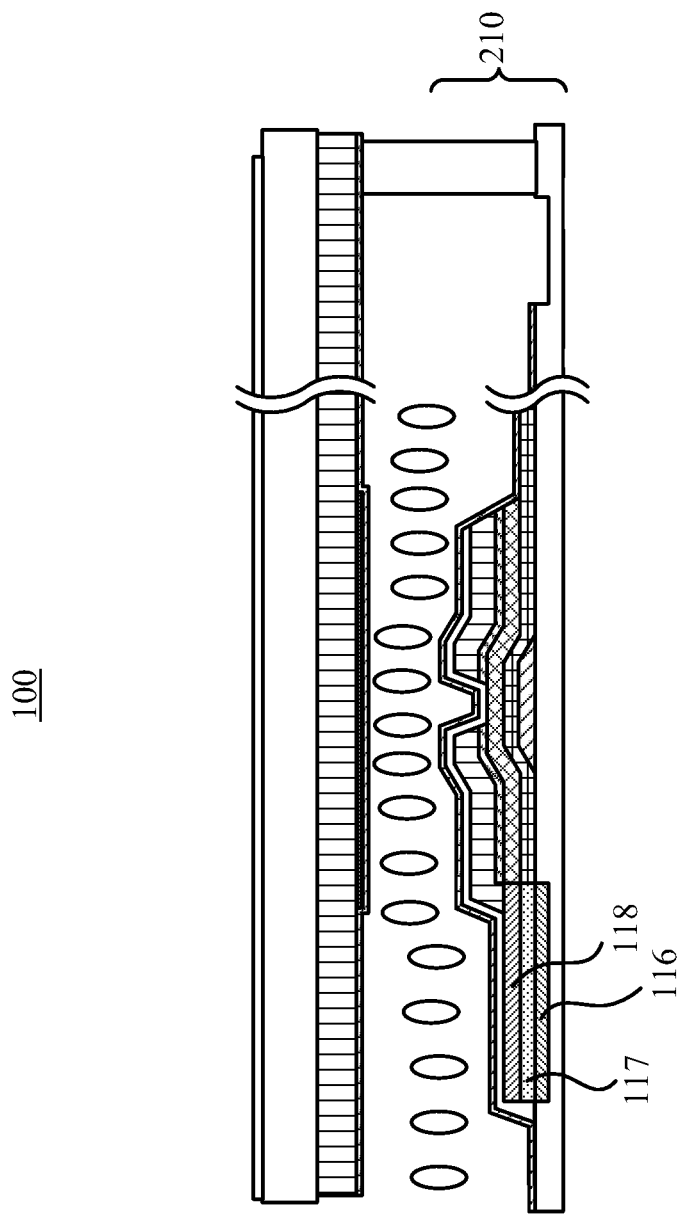
FIG. 9 is a cross-sectional view of the LCD panel as shown in FIG. 1 according to a second embodiment of the present invention.

Referring to FIG. 9, FIG. 9 is a cross-sectional view of the LCD panel 100 as shown in FIG. 1 according to a second embodiment of the present invention. The difference between the COA substrate 110 as shown in FIG. 2 and a COA substrate 210 as shown in FIG. 9 is that the COA substrate 210 comprises a spacer layer 117 disposed between the color filter unit 116 and the pixel electrode 118. The spacer layer 117 is used for separating the color filter unit 116 from the pixel electrode 118.

Referring to FIGS. 10 to 16, FIGS. 10 to 16 show schematic diagrams of manufacturing the COA substrate 210 as shown in FIG. 9.

Figure 10:
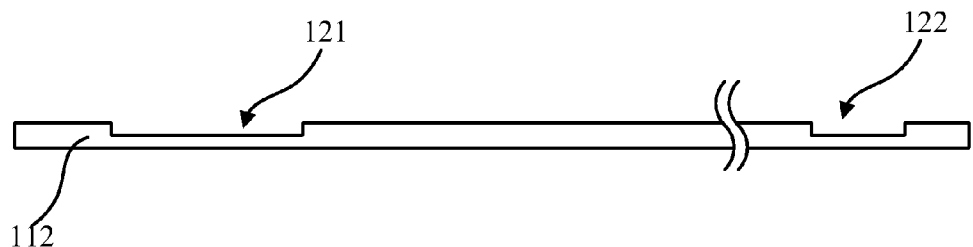
FIGS. 10 to 16 show schematic diagrams of manufacturing the COA substrate as shown in FIG. 9.

Please refer to FIG. 10. First, a transparent substrate 112 is provided. The transparent substrate 112 is etched, using a first mask (not shown), for forming a first groove 121 and a second groove 122. The second groove 122 is disposed around the periphery of the transparent substrate 112.

Figure 11:
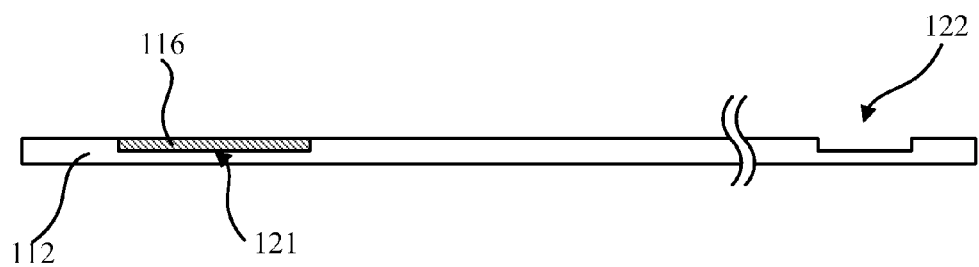

Please refer to FIG. 11. Next, a color filter layer is deposited on the transparent substrate 112 and etched, using a second mask (not shown), so that the color filter unit 116 could be disposed in the first groove 121.

Figure 12:
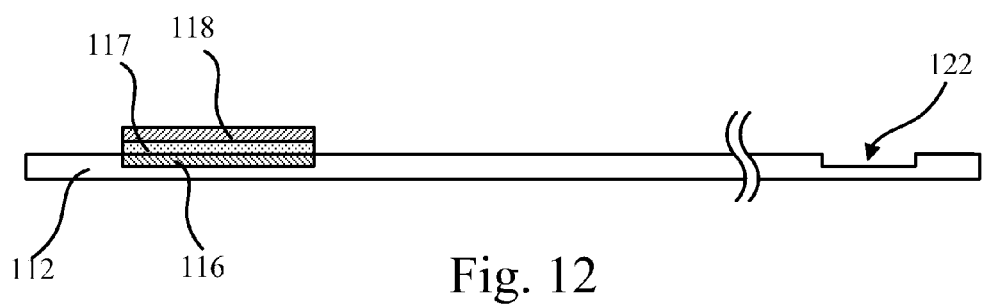

Please refer to FIG. 12. First, a spacer layer 117 is deposited on the color filter unit 116. Next, a transparent conducting layer is deposited on the spacer layer 117. At this point, the spacer layer 117 and the transparent conducting layer are etched, using a third mask (not shown), for forming the pixel electrode 118 on top of the color filter unit 116. The spacer layer 117 is disposed between the color filter unit 116 and the pixel electrode 118.

Figure 13:
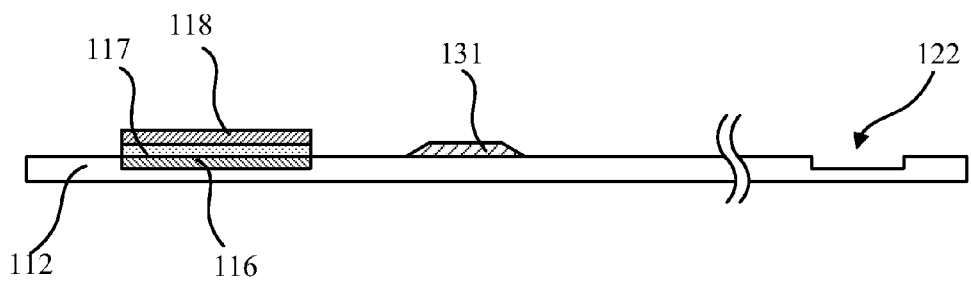

Please refer to FIG. 13. A first metal layer is formed on the transparent substrate 112 and etched, using a fourth mask (not shown), for forming a scan line SL and a gate 131 of the TFT 114. The scan line SL and the gate 131 are formed using the same metal layer.

Figure 14:
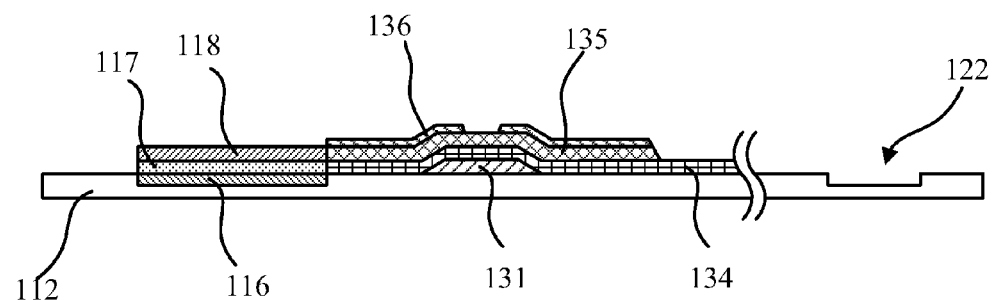

Please refer to FIG. 14. An insulating layer 134 is deposited on the transparent substrate 112, the scan line SL, and the gate 131. Then, an active layer 135 and an ohmic contact layer 136 are deposited on the insulating layer 134. At this point, the active layer 135 and the ohmic contact layer 136 are etched, using a fifth mask (not shown), for defining a channel of the TFT 114.

Figure 15:
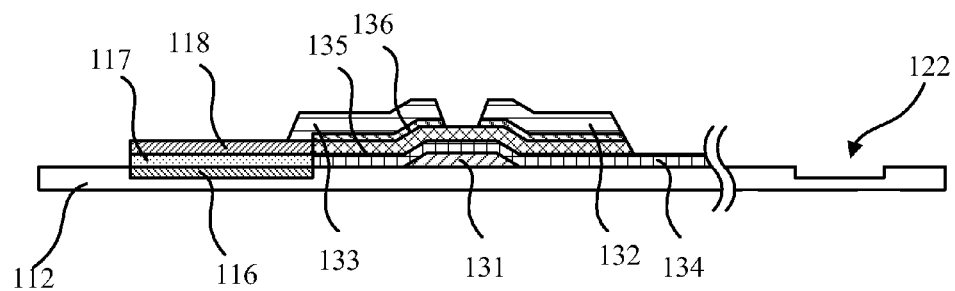

Refer to FIG. 15. A second metal layer is deposited on the ohmic contact layer 136 and the insulating layer 134 and etched, using a sixth mask (not shown), for forming a data line DL. At this point, a source 132 of the TFT 114 and a drain 133 of the TFT 114 are formed on the ohmic contact layer 136. The drain 133 is connected to the pixel electrode 118. The data line DL, the source 132, and the drain 133 are formed using the same metal layer.

Figure 16:
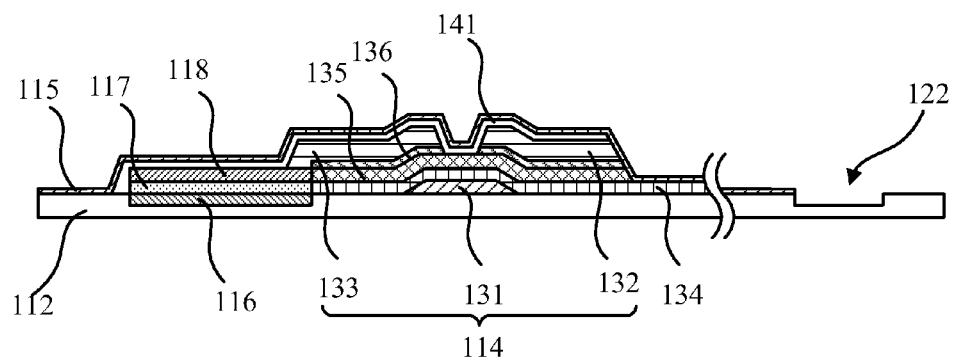

Please refer to FIG. 16. A passivation layer 141 is deposited on the ohmic contact layer 136, the source 132, the drain 133, the pixel electrode 118, and the insulating layer 134. The passivation layer 141 is used for separating a liquid crystal layer 150 (referring to FIG. 9) from the TFT 114. Afterwards, the TFT 114 which has been formed on the transparent substrate 112 is connected to the pixel electrode 118. Finally, PI drops are spread to form an alignment film 115. The following steps will be readily apparent to those skilled in the art, so the detailed description of the following steps will not herein be repeated.

Followed by the process as shown in FIG. 13, another process could be that the insulating layer 134, the active layer 135, the ohmic contact layer 136, and the second metal layer are successively deposited. Afterwards, the second metal layer, the ohmic contact layer 136, and the active layer 135 are etched, using the fourth mask, for forming the source 132, the drain 133, and the channel of the TFT 114. Finally, the passivation layer 141 and the alignment film 115 are formed on the ohmic contact layer 136, the source 132, the drain 133, and the pixel electrode 118.

Referring to FIGS. 17 to 20, FIGS. 17 to 20 show schematic diagrams of another manufacturing process of the COA substrate 210 as shown in FIG. 9.

Figure 17:
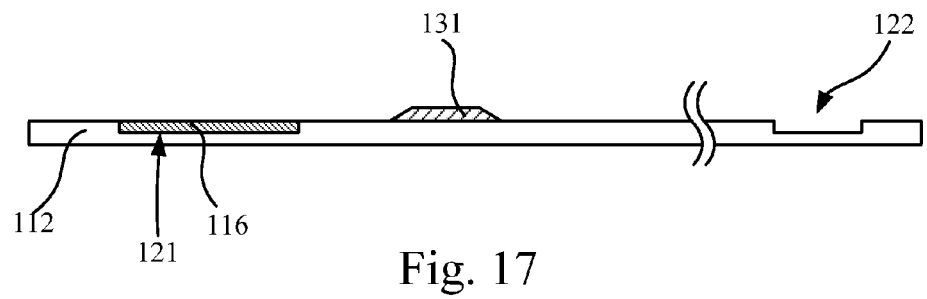
FIGS. 17 to 20 show schematic diagrams of another manufacturing process of the COA substrate as shown in FIG. 9.

Please refer to FIG. 17. Followed by the process of the color filter unit 116 being disposed in the first groove 121, the first metal layer is formed on the transparent substrate 112 and etched, using a third mask (not shown), so that the scan line SL and the gate 131 of the TFT 114 could be formed. The scan line SL and the gate 131 are formed using the same metal layer.

Figure 18:
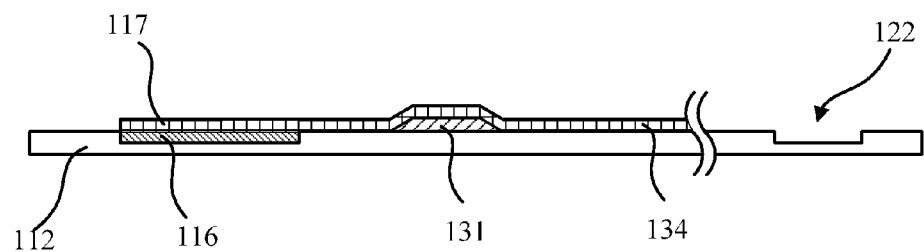

Please refer to FIG. 18. An insulating layer is deposited on the color filter unit 116, the scan line SL, and the gate 131, thereby forming the spacer layer 117 and the insulating layer 134.

Figure 19:
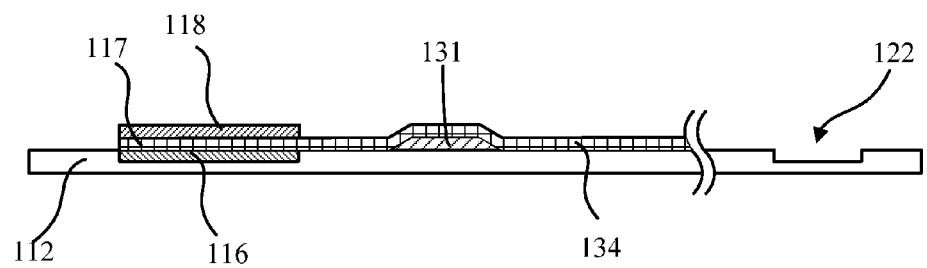

Please refer to FIG. 19. The transparent conducting layer is deposited and etched, using the fourth mask (not shown), for forming the pixel electrode 118 on top of the color filter unit 116. The spacer layer 117 is disposed between the color filter unit 116 and the pixel electrode 118.

Figure 20:
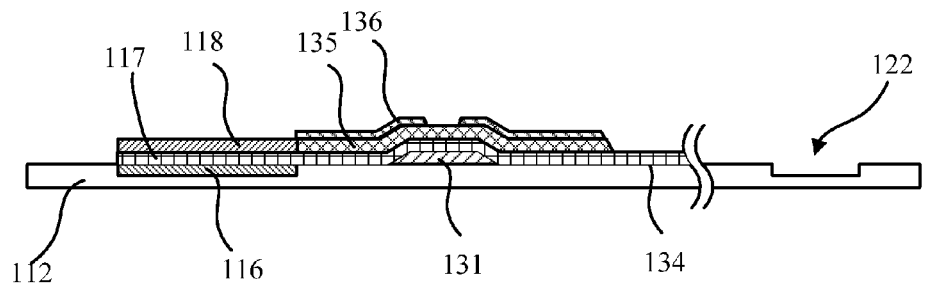

Please refer to FIG. 20. Afterwards, an active layer 135 and an ohmic contact layer 136 are deposited on the insulating layer 134. Then, the active layer 135 and the ohmic contact layer 136 are etched, using a fifth mask (not shown), for defining a channel of the TFT 114.

The following manufacturing process is the same as that as shown in FIG. 15 and FIG. 16.

Followed by the process as shown in FIG. 19, another process could be that the active layer 135, the ohmic contact layer 136, and the second metal layer are successively deposited. Afterwards, the second metal layer, the ohmic contact layer 136, and the active layer 135 are etched, using the fourth mask, for forming the source 132, the drain 133, and the channel of the TFT 114. Finally, the passivation layer 141 and the alignment film 115 are formed on the ohmic contact layer 136, the source 132, the drain 133, and the pixel electrode 118.

Figure 21:
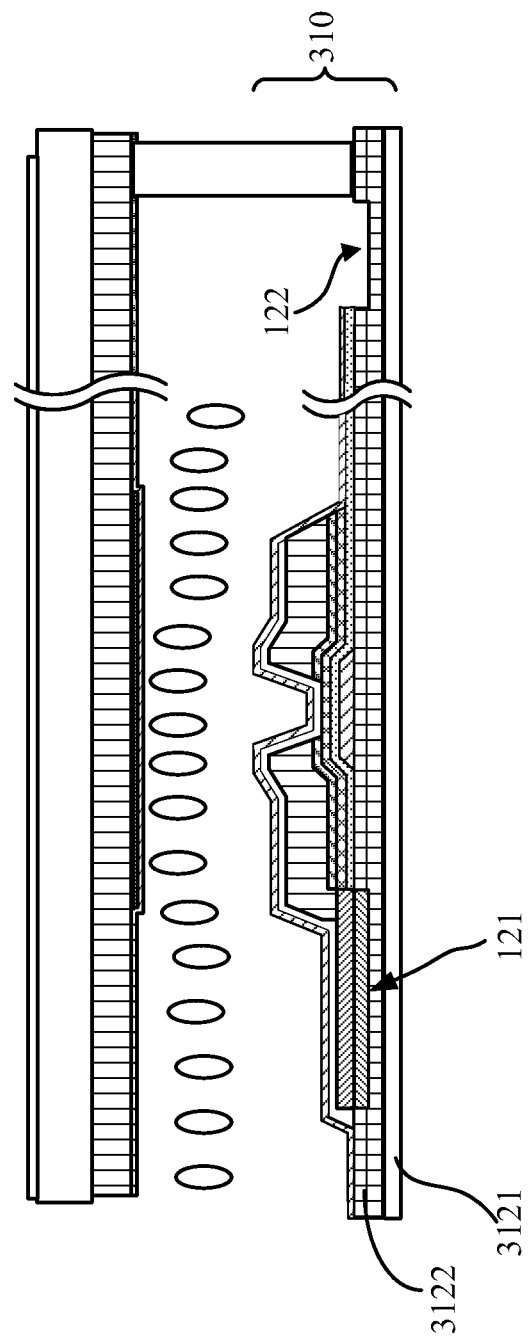
FIG. 21 is a cross-sectional view of the LCD panel as shown in FIG. 1 according to a third embodiment of the present invention.

Referring to FIG. 21, FIG. 21 is a cross-sectional view of the LCD panel 100 as shown in FIG. 1 according to a third embodiment of the present invention. The difference between the COA substrate 110 as shown in FIG. 2 and the COA substrate 310 as shown in FIG. 21 is that the COA substrate 310 comprises a transparent substrate 112 comprising a base 3121 and an insulating layer 3122. A first groove 121 and a second groove 122 are formed in the insulating layer 3122.

The difference of the manufacturing method between the COA substrate 110 as shown in FIG. 2 and the COA substrate 310 is that the insulating layer 3122 is etched, using a first mask (not shown), for forming the first groove 121 and the second groove 122. The following manufacturing process of the COA substrate 310 is the same as that of the COA substrate 110, so the detailed description of the following manufacturing process will not herein be repeated.

Figure 22:
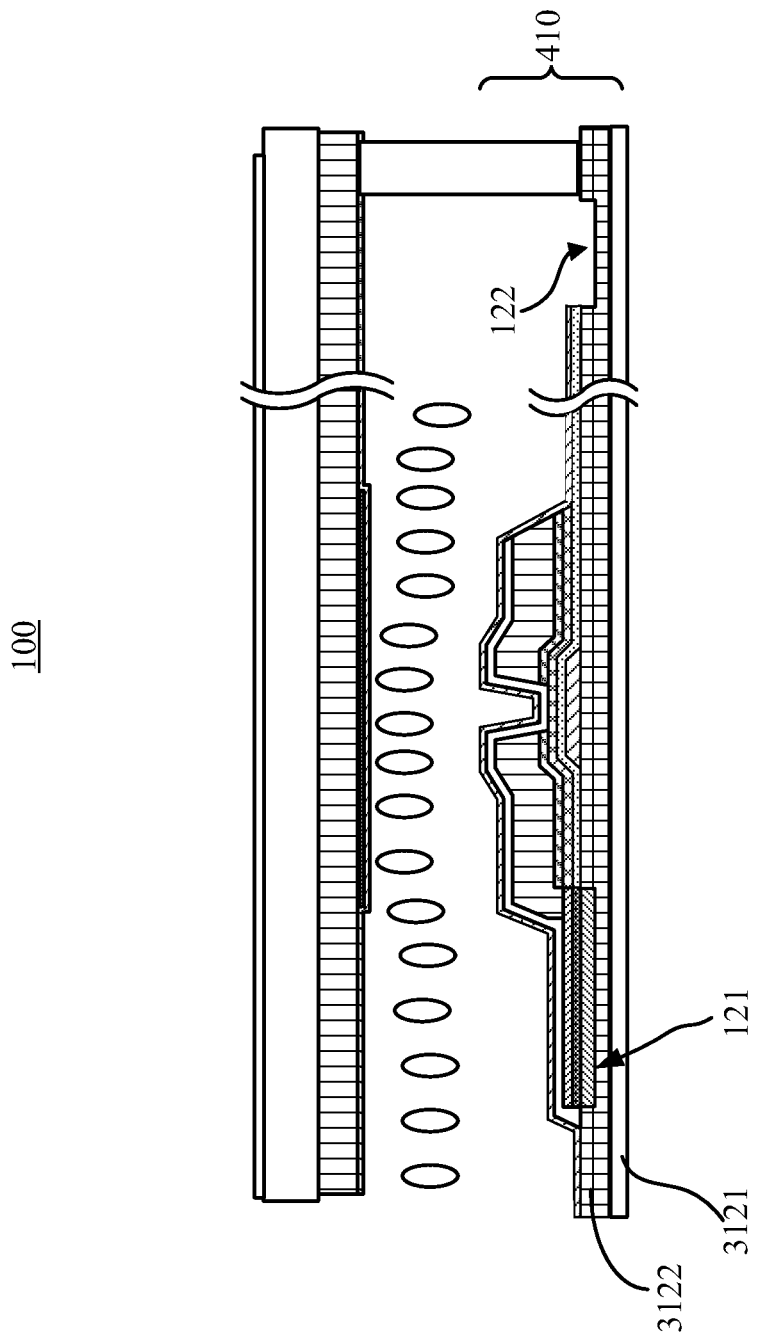
FIG. 22 is a cross-sectional view of the LCD panel as shown in FIG. 1 according to a fourth embodiment of the present invention.

Referring to FIG. 22, FIG. 22 is a cross-sectional view of the LCD panel 100 as shown in FIG. 1 according to a fourth embodiment of the present invention. The difference between the COA substrate 210 as shown in FIG. 9 and the COA substrate 410 as shown in FIG. 22 is that the COA substrate 410 comprises a transparent substrate 112 comprising a base 3121 and an insulating layer 3122. A first groove 121 and a second groove 122 are formed in the insulating layer 3122.

The difference of the manufacturing method between the COA substrate 410 and the COA substrate 210 is that the insulating layer 3122 of the COA substrate 410 is etched, using a first mask (not shown), for forming the first groove 121 and the second groove 122. The following manufacturing process of the COA substrate 410 is the same as that of the COA substrate 210 as shown in FIG. 9, so the detailed description of the following manufacturing process will not herein be repeated.

Both of the transparent substrate 112 and the insulating layer 3122 on the base 3121 on each of the COA substrates 110, 210, 310, and 410 in the embodiments of the present invention are etched for forming the first groove 121. The color filter unit 116 is formed on the first groove 121. The pixel electrode 118 is formed on the color filter unit 116. In other words, the color filter unit 116 is formed on the first groove 121 and the pixel electrode 118 is formed on the color filter unit 116. So it is unnecessary to form a via through which the drain of the TFT is connected to the pixel electrode 118 on the passivation layer 141. So etching the passivation layer 141 for forming the via is omitted in the present invention. In addition, the pixel electrode 118 is disposed on top of the color filter unit 116, implying that it is impossible for the transparent conducting layer to be used as the pixel electrode 118. It is unnecessary to worry about the deposition of the transparent conducting layer serving as the pixel electrode 118 on the via of the passivation layer 141. Therefore, ESD will not occur on the finished LCD panel 100. Moreover, the transparent substrate 112 is etched for forming the second groove 122. The second groove 122 is formed at the periphery of the transparent substrate 112. The second groove 122 could be used for collecting abundant sealant materials or abundant materials for fabricating the alignment film 115, preventing the sealant 117 from overlapping the alignment film 115. Since the sealant 117 does not overlap the alignment film 115, the yield of the LCD panel 100 is not negatively affected.

The LCD panel 100 as shown in FIG. 1 is exemplified in the present invention. Each of the COA substrates 110, 210, 310, and 410 in the embodiments of the present invention is also used in a White Organic Light Emitting Diode (WOLED) display panel.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A manufacturing method for a color filter on array (COA) substrate, comprising the following steps of:
   providing a transparent substrate;
   etching the transparent substrate for forming a first groove and a second groove being disposed at a periphery of the transparent substrate;
   depositing a color filter layer on the transparent substrate and etching the color filter layer, for forming a color filter unit in the first groove and then forming a pixel electrode on the color filter unit;
   forming a thin film transistor (TFT) on the transparent substrate so as to connect the TFT to the pixel electrode;
   disposing an alignment film on the TFT and the pixel electrode, and
   disposing a sealant at a periphery of the color filter layer,
   wherein the second groove is disposed between the sealant and the alignment film, and the second groove is used to collect abundance of the sealant and the alignment film.

2. The manufacturing method as claimed in claim 1, wherein the transparent substrate comprises a base and an insulating layer, and the step of etching the transparent substrate for forming a first groove is: etching the insulating layer for forming the first groove.

3. The manufacturing method as claimed in claim 1, wherein the step of forming the TFT comprises the following steps of:
   forming a first metal layer on the transparent substrate and etching the first metal layer for forming a gate of the TFT;
   depositing the insulating layer on the transparent substrate and the gate;
   depositing an active layer and an ohmic contact layer on the insulating layer;
   etching the active layer and the ohmic contact layer so that the active layer is used as a channel of the TFT;
   depositing a second metal layer on the ohmic contact layer and the insulating layer and etching the second metal layer for forming a source and a drain of the TFT on the ohmic contact layer, and the drain connected to the pixel electrode; and
   depositing a passivation layer on the source, the drain, the pixel electrode, and the insulating layer.

4. The manufacturing method as claimed in claim 1, wherein the step of forming the TFT comprises the following steps of:
   forming a first metal layer on the transparent substrate and etching the first metal layer for forming the gate of the TFT;
   depositing an insulating layer on the transparent substrate and the gate;
   depositing an active layer, an ohmic contact layer, and a second metal layer successively on the insulating layer;
   etching the second metal layer and the ohmic contact layer so that the active layer is used as the channel of the TFT, meanwhile, forming the source and the drain of the TFT on the ohmic contact layer, and the drain connected to the pixel electrode;
   depositing a passivation layer on the source, the drain, the pixel electrode, and the insulating layer.

5. A manufacturing method for a COA substrate, comprising the following steps of:
   providing a transparent substrate;
   etching the transparent substrate for forming a first groove and a second groove being disposed at a periphery of the transparent substrate;
   depositing a color filter layer on the transparent substrate and etching the color filter layer for forming a color filter unit in the first groove;
   depositing a spacer layer on the color filter layer;
   depositing a transparent conducting layer on the spacer layer and etching the transparent conducting layer, for forming the pixel electrode on top of the color filter unit;
   forming a TFT on the transparent substrate so as to connect the TFT to the pixel electrode
   disposing an alignment film on the TFT and the pixel electrode, and
   disposing a sealant at a periphery of the color filter layer,
   wherein the second groove is disposed between the sealant and the alignment film, and the second groove is used to collect abundance of the sealant and the alignment film.

6. The manufacturing method as claimed in claim 5, wherein the transparent substrate comprises a base and an insulating layer, and the step of etching the transparent substrate for forming the first groove is: etching the insulating layer for forming the first groove.

7. The manufacturing method as claimed in claim 5, wherein the step of forming the TFT comprises the following steps of:
   forming a first metal layer on the transparent substrate and etching the first metal layer, for forming a gate of the TFT;
   depositing an insulating layer on the transparent substrate and the gate;
   depositing an active layer and an ohmic contact layer on the insulating layer;
   etching the active layer and the ohmic contact layer so that the active layer is used as a channel of the TFT;
   depositing a second metal layer on the ohmic contact layer and the insulating layer and etching the second metal layer forming a source and a drain of the TFT on the ohmic contact layer, and the drain connected to the pixel electrode; and
   depositing a passivation layer on the source, the drain, the pixel electrode, and the insulating layer.

8. The manufacturing method as claimed in claim 5, wherein the manufacturing method further comprises steps interposed between the step of depositing a color filter layer on the transparent substrate and etching the color filter layer for forming the color filter unit in the first groove and the step of depositing a spacer layer on the color filter layer:
   forming a first metal layer on the transparent substrate and etching the first metal layer, for forming the gate of the TFT; and
   depositing an insulating layer on the transparent substrate and the gate.

9. The manufacturing method as claimed in claim 8, wherein the step of forming the TFT comprises the following steps of:
   depositing an active layer and an ohmic contact layer on the insulating layer;
   etching the active layer and the ohmic contact layer so that the active layer is used as the channel of the TFT;
   depositing a second metal layer on the ohmic contact layer and the insulating layer and etching the second metal layer, forming the source and the drain of the TFT on the ohmic contact layer, and the drain connected to the pixel electrode; and depositing a passivation layer on the source, the drain, the pixel electrode, and the insulating layer.

10. The manufacturing method as claimed in claim 8, wherein the step of forming the TFT comprises the following steps of:

depositing an active layer, an ohmic contact layer, and a second metal layer successively on the insulating layer, and etching the active layer, the ohmic contact layer, and the second metal layer, forming a the channel, the source and the drain of the TFT, and the drain connected to the pixel electrode; and depositing a passivation layer on the source, the drain, the pixel electrode, and the insulating layer.

11. A COA substrate, comprising:

a transparent substrate, having a first groove and a second groove disposed at a periphery of the transparent substrate;

a TFT, disposed on the transparent substrate and comprising a gate, a drain, and a source;

a color filter unit, disposed in the first groove;

a pixel electrode, disposed on the color filter unit and coupled to the drain of the TFT an alignment film, disposed on the TFT and the pixel electrode, and a sealant, disposed at a periphery of the color filter layer wherein the second groove is disposed between the sealant and the alignment film, and the second groove is used to collect abundance of the sealant and the alignment film.

12. The COA substrate as claimed in claim 11, wherein the transparent substrate comprises a base and an insulating layer, and the first groove is formed by etching the insulating layer.

13. The COA substrate as claimed in claim 11, wherein the COA substrate further comprises a spacer layer disposed between the color filter unit and the pixel electrode.

* * * * *